(12) United States Patent
Nguyen et al.

(10) Patent No.: US 6,267,629 B1
(45) Date of Patent: Jul. 31, 2001

(54) SHIELD CLIP AND METHOD OF SECURING A SHIELD COVER

(75) Inventors: Cam T. Nguyen, San Diego; Darrin J. Marthens; Michael G. Matthews, both of Poway; David J. Saltzman, San Diego, all of CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 09/318,716

(22) Filed: May 26, 1999

Related U.S. Application Data
(60) Provisional application No. 60/106,006, filed on Oct. 28, 1998.

(51) Int. Cl.⁷ .............................. H01R 11/22; H01R 13/11
(52) U.S. Cl. ..................... 439/857; 174/35 C; 361/818
(58) Field of Search .......................... 439/857; 174/35 C, 174/35 R; 361/818, 816

(56) References Cited

U.S. PATENT DOCUMENTS

| | | | |
|---|---|---|---|
| 4,890,199 | * 12/1989 | Beutler | 361/818 |
| 5,250,751 | * 10/1993 | Yamaguchi | 174/35 GC |
| 5,354,951 | * 10/1994 | Lange, Sr. et al. | 174/35 R |
| 5,545,843 | * 8/1996 | Arvidsson et al. | 174/35 GC |
| 5,564,952 | * 10/1996 | Davis | 439/682 |
| 5,577,268 | * 11/1996 | Ho et al. | 455/90 |

\* cited by examiner

Primary Examiner—Brian Sircus
Assistant Examiner—Brian S. Webb
(74) Attorney, Agent, or Firm—Philip Wadsworth; Charles Brown; Bruce W. Greenhaus (57) ABSTRACT

A method of clipping and a clip configured to retain a cover onto a circuit board. The clip comprises a base plate having right and left sides. The base plate is configured to be fixed to the circuit board. The clip further comprises at least two right walls connected to and extending upwardly away from the base plate. Each of the right walls has a right upper portion. The clip further comprises at least two left walls connected to and extending upwardly away from the base. Each of the left walls has a left upper The right and left walls are spring biased inwardly so that at least a portion of the right and left upper portions overlap. In another embodiment, the right wall includes at least one opening and the left wall includes a middle segment extending towards the opening of the right wall.

7 Claims, 9 Drawing Sheets

SHIELD CLIP AND METHOD OF SECURING A SHIELD COVER

CROSS-REFERENCE TO PROVISIONAL APPLICATION

This application claims the benefit of U.S. Provisional Application No. 60/106,006, filed Oct. 28, 1998.

BACKGROUND OF THE INVENTION

I. Field of the Invention

The invention relates generally to shields used in the protection of electrical components from electromagnetic and radio frequency interference (EMI/RFI). More particularly, the invention relates to shield clips and methods of providing EMI/RFI shielding in communication devices.

II. Description of the Related Art

Figure 1:
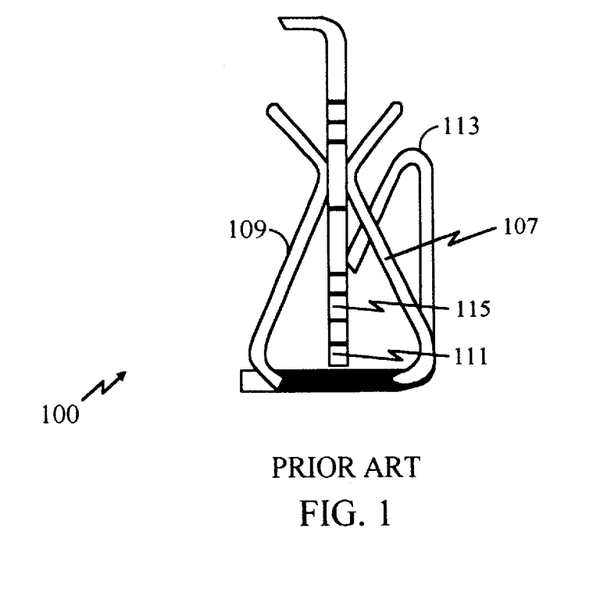
FIG. 1 is a front elevation view of a conventional RF shield clip.
Figure 2:
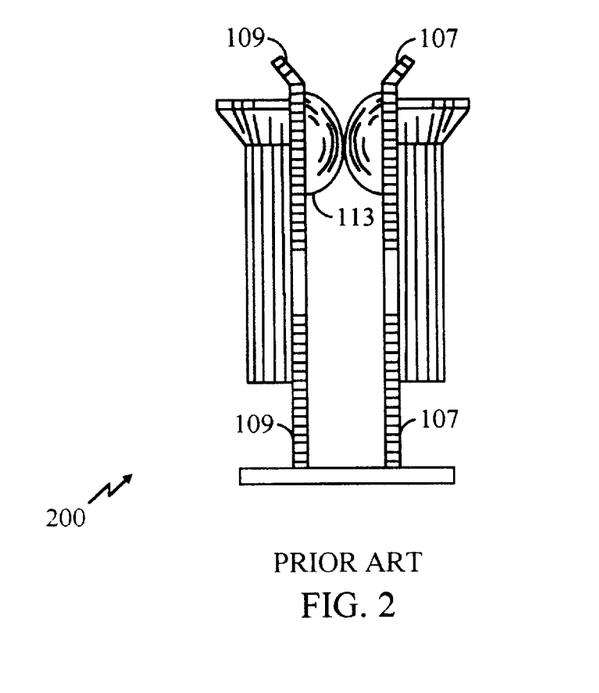
FIG. 2 is a front elevation view of another conventional RF shield clip.

Electrical components, such as resistors, capacitors, and semiconductor components, are often subjected to undesirable emissions, such as EMI/RFI, from neighboring emitting components. These emissions interfere with the operation of such components by temporarily altering or distorting their essential characteristics and, consequently, performance. Several methods are used to protect and shield components such as these from EMI/RFI occurring in proximity to a printed circuit board (PCB). A first method involves directly soldering an RF shield to a ground plane of a PCB around RF emitting components. A second method involves the use of shield clips coupled to the ground plane of a PCB to which an RF shield is permanently attached. A third method involves the use of removable RF shields attached to shield clips coupled to the ground plane of a PCB. FIGS. 1 and 2 illustrate a front elevation view of two such conventional RF shield clips.

Several problems are associated with the applicability of these shielding devices and methods. For example, in the first method, it is often time consuming to solder RF shields to the ground plane of the PCB, thereby making the manufacturing process costly and inefficient. More importantly, by soldering RF shields to the PCB, it is highly cumbersome and often impossible to troubleshoot, repair, or replace components that are covered by the RF shield. In the second method, the permanent attachment of the RF shield to the shield clips subjects this method to problems similar to those associated with the first method.

In the third method, the shield clips often lose their spring tension that makes them unable to maintain a shield cover in place. As illustrated in FIGS. 1 and 2, two shield clips 100 and 200 are shown, each comprising a pair of side walls 107, 109 and 207, 209. Each pair of side walls is spring biased inwardly toward the other, and bends outwardly in response to introduction of a shield cover between the walls, thus permitting insertion of the shield cover wall, e.g., a shield wall 115. The spring tension of each pair of side walls attempts to keep the shield wall 115 in place over time. However, these shield clips tend to lose their spring tension and, hence, lack a sufficient grip to keep the shield wall 115 in place. To minimize the effects of lost tension, the shield clip 100 includes a locking latch 113 that locks the shield wall 115 in place. The shield wall 115 includes one or more grooves, each groove suitable for receiving the tip of the locking latch 113. The lock latch 113 inserts into one of the grooves and, by virtue of its tension, locks the shield wall 115 in place. The use of the latch 113, however, makes the shield cover more cumbersome and difficult to remove. Thus, having such a locking mechanism may defeat the purpose of maintaining removability of the shield cover.

Additionally, the soldering reflow may come in contact with the lower edge 111 of the shield wall 115 thereby making the shield cover difficult to remove from or become stuck in the shield clip. Consequently, troubleshooting, repairing, or replacing one or more components covered by the soldered RF shield is impaired. For further details on removable RF shields, reference is made to U.S. Pat. No. 5,577,268 issued to Ho et al., which is incorporated by reference.

Another problem associated with RF shielding involves the use of a large number (e.g., 10–50) of small RF shields. Typically, these RF shields are rectangular in shape with a width in the range of 1–5 millimeters (mm) and a length in the range of 1–5 mm. Mounting such a large number of small RF shields on the PCB increases the manufacturing time of the PCB and, consequently, implicates manufacturing costs.

Therefore, there is a need in the RF shielding technology to provide a removable shield that may be placed on PCBs using reliable shield clips, despite repetitive removal of the RF shield. Additionally, the RF shield should be designed to ensure separation from the solder reflow to ensure ease of removal from the PCB.

SUMMARY OF THE INVENTION

To overcome the above-mentioned limitations, the invention provides a clip configured to attach a cover onto a circuit board. In a first embodiment, the clip comprises a base plate that is constructed to be fixed to the circuit board. The clip further comprises at least one right wall connected to the base plate, the right wall having a right upper portion. The clip further comprises at least one left wall connected to the base plate, the left wall having a left upper portion, wherein the upper portions are configured to overlap in their resting position. In a second embodiment, the invention provides a clip configured to retain a cover onto a circuit board. The clip comprises a base plate having right and left sides, the base plate being configured to be fixed to the circuit board. The clip further comprises at least two right walls connected to and extending upwardly away from the right side of the base, each of the right walls having a right upper portion. The clip further comprises at least two left walls connected to and extending upwardly away from the left side of the base. Each of the left walls has a left upper portion, wherein the right and left walls are spring biased inwardly so that at least a portion of the right and left upper portions overlap.

In a third embodiment, the clip comprises means for supporting the clip, the support means being constructed to be fixed to the circuit board. The clip further comprises at least one right means for retaining the cover connected to the support means, the right retaining means having a right upper portion. The clip further comprises at least one left means for retaining the cover connected to the support means, the left retaining means having a left upper portion, wherein the upper portions are configured to overlap in their resting position. In a fourth embodiment, the clip comprises a base plate that is configured to be fixed to the circuit board. The clip further comprises a right wall connected to the base plate, the right wall having at least one opening. The clip further comprises a left wall connected to the base plate. The left wall has at least one middle segment that extends towards the right wall and away from the left wall. At least a portion of the middle segment is substantially aligned with the opening. In a fifth embodiment, the clip comprises means for supporting the clip, the supporting means being configured to be fixed to the circuit board. The clip further comprises right means for retaining the cover connected to the supporting means, the right retaining means having at least one opening. The clip further comprises left means for retaining the cover connected to the supporting means. The left retaining means has at least one middle segment that extends towards the right retaining means and away from the left retaining means. At least a portion of the middle segment is substantially aligned with the opening.

The invention further provides a method of securing a cover to a circuit board. The method comprises the step of fixing a base plate onto the circuit board, the base plate having at least one right wall and at least one left wall connected to the base plate. Each right wall has a right upper portion and each left wall has a left upper portion, wherein at least a portion of the upper portions are spring biased to overlap in their resting position. The method further comprises the step of sliding at least a portion of the cover between the right and left walls, so that each of the right and left walls presses against at least a portion of the cover.

In another embodiment, the method comprises the step of fixing a base plate onto the circuit board, the base plate having a right wall and left wall connected to the base plate. The right wall has at least one opening and the left wall has at least one middle segment that extends towards the right wall and away from the left wall. At least a portion of the middle segment is substantially aligned with the opening. The method further comprises the step of sliding at least a portion of the cover between the right and left walls, so that each of the right and left walls presses against at least a portion of the cover.

BRIEF DESCRIPTION OF THE DRAWINGS

The above and other aspects, features and advantages of the invention will be better understood by referring to the following detailed description, which should be read in conjunction with the accompanying drawings, in which.

DETAILED DESCRIPTION OF THE INVENTION

The following description is not to be taken in a limiting sense, but is made merely for the purpose of describing the general principles of the invention. The scope of the invention should be determined with reference to the claims.

Figure 3:
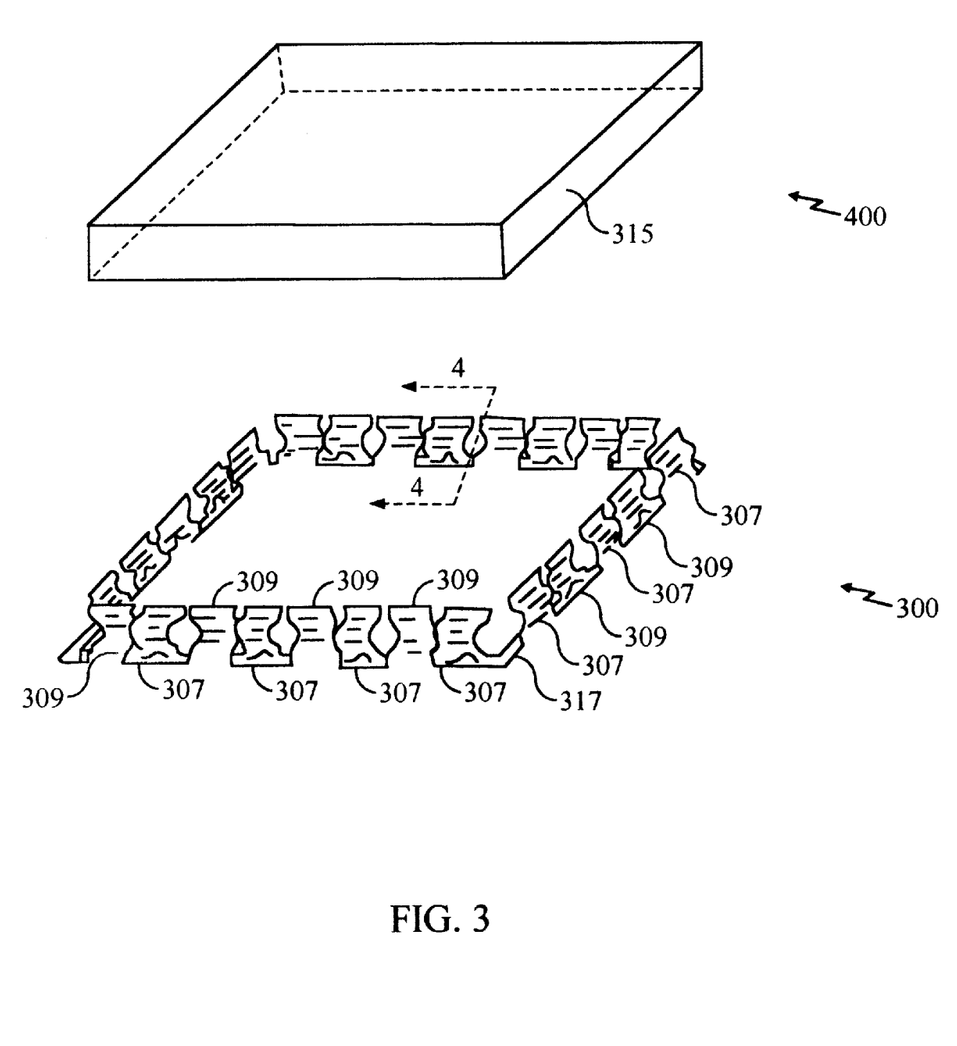
FIG. 3 is a perspective view of one embodiment of the shield clip in accordance with the invention.

FIG. 3 is a perspective view of one embodiment of the shield clip in accordance with the invention. The shield clip 300 may have a rectangular shape with four sides suitable for receiving and retaining a four-sided cover 400. As shown in FIG. 3, each side of the shield clip 300 includes two or more spring biased side walls 307 and 309. The side walls 307 and 309 extend upwardly from the base plate 317, so that each side wall 307 does not face any of the side walls 309. As explained in greater detail in the next section, as each side wall 307 extends upwardly from the base plate 317, the side wall 307 curves inwardly (i.e., towards the center of the base plate 317) and outwardly (i.e., away from the center of the base plate 317). Similarly, as each side wall 309 extends upwardly from the base plate 317, the side wall 309 curves inwardly and outwardly. The base plate 317 is affixed to a circuit board 319. To place the cover 400 into the shield clip 300, the cover 400 is aligned between the side walls 307 and 309 and pushed downwardly, i.e., towards the base plate 317. The side walls 307 and 309 are spring biased toward the plane lying between them so that each pair of the side walls 307 and 309 presses against a downwardly oriented wall 315 of the cover 400 and retains that wall in place.

Figure 4:
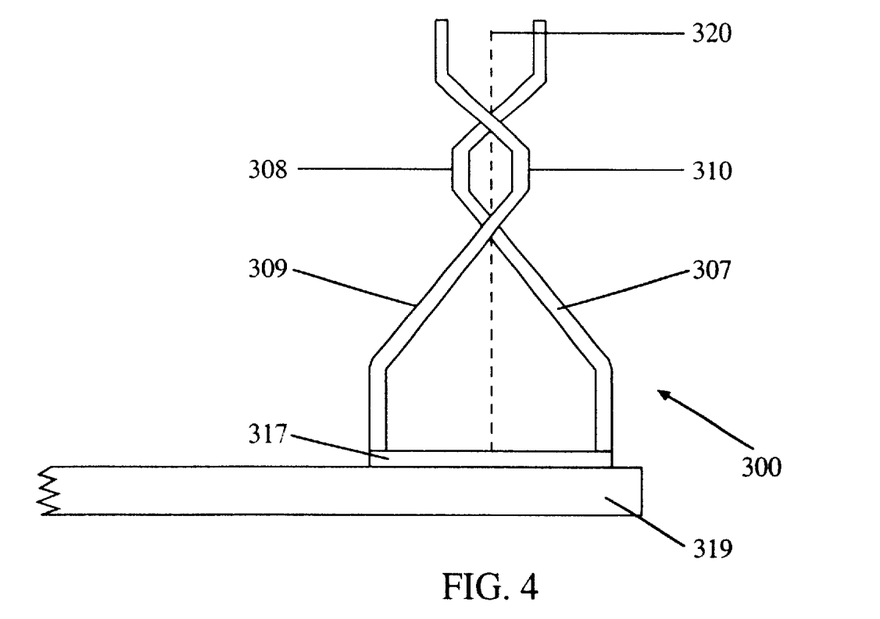
FIG. 4 is a cross-sectional view of a side of the shield clip taken along line 4—4 of FIG. 3.

FIG. 4 is a cross-sectional view of a side of the shield clip 300 taken along line 4—4 (FIG. 3). As shown in FIG. 4, for the purpose of illustration, a virtual geometric plane 320 that is normal to the base plate 317 is also shown. As used herein, the term "overlapping" indicates that, in its resting position, the tension of the side wall 307 causes at least a portion of the upper segment 308 to be in the region to the left of the normal plane 320. Similarly, the overlapping feature indicates that, in its resting position, the tension of the side wall 309 causes at least a portion of the upper segment 310 be placed in the region to the right of the normal plane 320. A shield clip having overlapping side walls is sometimes referred to as a bent or curved shield clip.

It is desirable to have the side walls 307 and 309 be located geometrically separate, i.e., in an alternating fashion, so that the upper segments 308 and 310 are not in direct contact with each other. Although only two side walls 307 and 309 are shown in the front elevation view of FIG. 4, it is understood that the shield clip 300 may comprise one or more additional side walls located in such alternating fashion. It is further desirable to have the design of the shield clip 300 dimension-independent. Hence, a shield clip 300 having any desirable dimensions fit to a particular application may be used. For example, the length and width of the base plate 317 may be in the range of about 0.05–2 and 0.05–0.20 inches, respectively. The height of the shield clip 300 may be in the range of about 0.10–0.40 inches.

Figure 5:
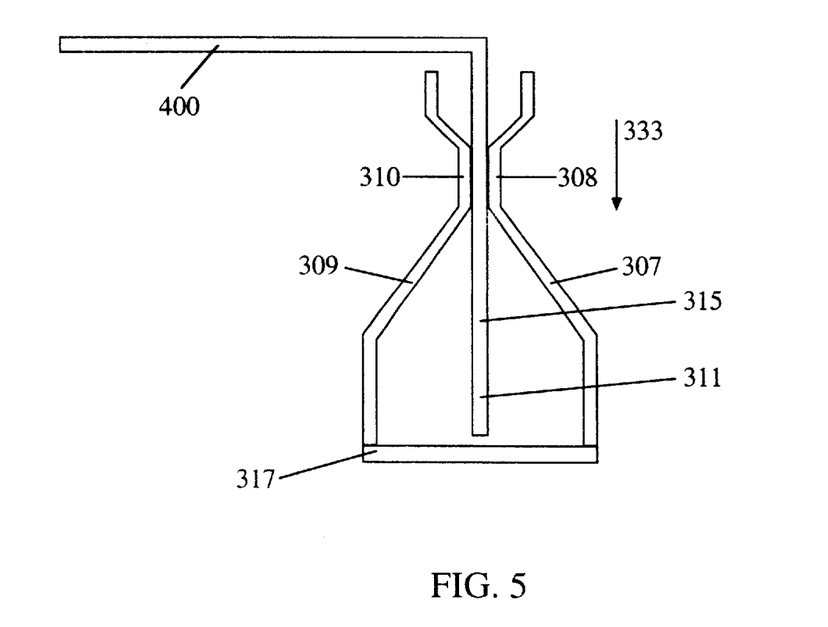
FIG. 5 is a front elevation view of a side of the shield clip of FIG. 3 having a shield cover placed therein.

FIG. 5 is a front elevation view of a side of the shield clip 300 having a shield cover 400 placed therein. As shown in FIG. 5, the shield cover 400 includes shield wall 315 having a lower portion 311 that is inserted into the shield clip 300. To allow insertion of the shield wall 315, the lower portion 311 slides between and pushes each of the side walls 307 and 309 outwardly causing the two side walls 307 and 309 to move apart and against the direction of their spring loading. The outward deflection of the side walls 307 and 309 allows insertion of the lower portion 311 in the direction of arrow 333. As illustrated in FIG. 5, the side walls 307 and 309 remain apart after insertion of the lower portion 311.

The tension of the side wall 307 forces the upper segment 308, and tension of the side wall 309 forces the upper segment 310, to each press against its contact surface on the shield wall 315. The pressing action by the upper segments 308 and 310 acts to release the lower portion 311 in a fixed position relative to the shield clip 300. Furthermore, the ability to so retain the lower portion 311 is particularly enhanced in this embodiment by the overlapping feature of the side walls 307 and 309. This enhanced pressing action ensures a long-lasting grip of the shield wall 315, despite repetitive removal of the shield wall 315 from the shield clip 300. Moreover, the shield cover 400 may easily be removed from the shield clip 300 by exerting reasonable pulling force on the shield cover 400 away from the shield clip 300 (i.e., in a direction opposite to the arrow 333).

Figure 6:
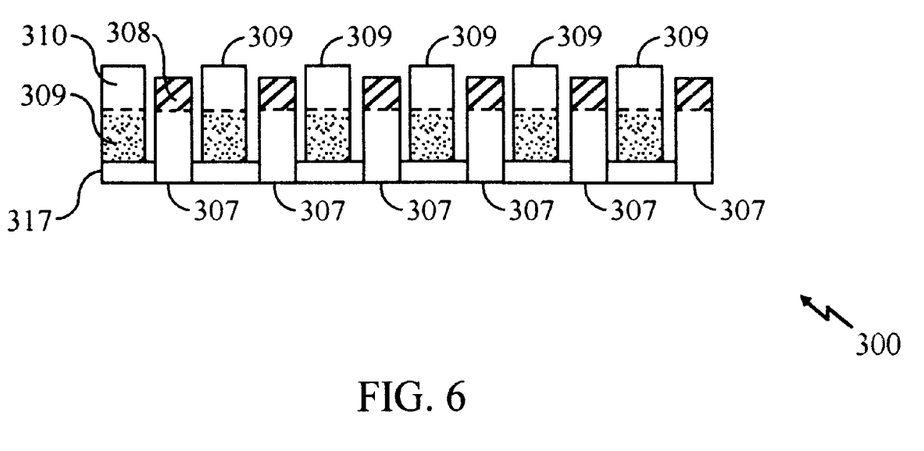
FIG. 6 is a side elevation view of the shield clip of FIG. 3.

FIG. 6 is a side elevation view of the shield clip 300. It is seen in that figure that the side walls 307 and 309 are positioned in an alternating fashion along the length of the base plate 317. As noted above, in their resting position, the upper segments 308 and 310 cross over the geometric plane 320 (FIG. 4). Upon insertion of the lower portion 311, the upper segments 308 and 310 deflect away from the overlapping position and past the geometric plane 320. As noted above, the shield clip 300 typically comprises a plurality of side walls 307 and 309 as shown in FIG. 6. By having more than two side walls 307 and 309, the shield clip 300 conforms to the shape of the shield cover 400 without bending or skewing the shield wall 315. Moreover, the presence of a plurality of side walls 307 and 309 increases the surface area from the contact between the side walls 307 and 309 and the shield wall 315. The increased surface area of contact ensures a grip having sufficient force to retain the shield cover 400 in place.

Figure 7:
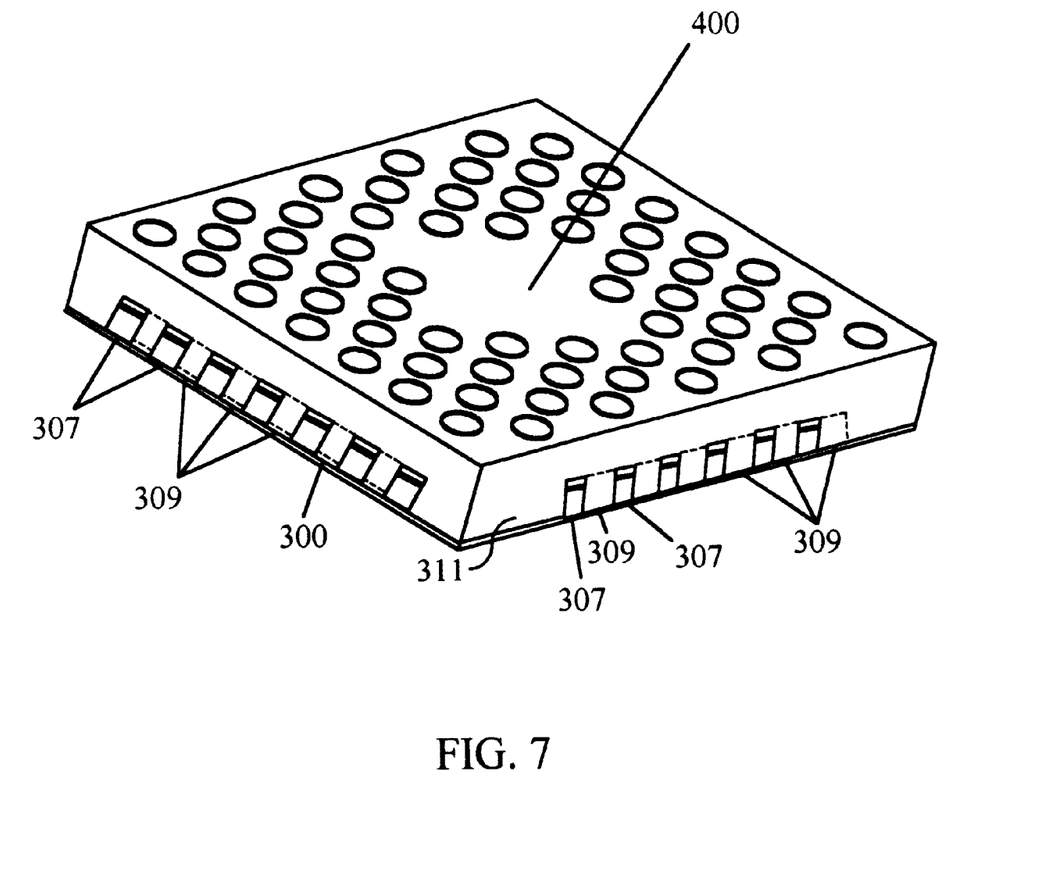
FIG. 7 is a perspective view of the shield cover placed in the shield clip of FIG. 3.

FIG. 7 is a perspective view of the shield cover 400 placed in the shield clip 300. As shown in FIG. 7, the shield cover 400 may be inserted into the shield clip 300 by aligning and pushing the lower portion 311 over and into the shield clip 300. Once the shield cover 400 is in place, the tension of the side walls 307 and 309 causes them to grip the lower portion 311 and maintain the shield cover 400 tight in place.

Figure 8:
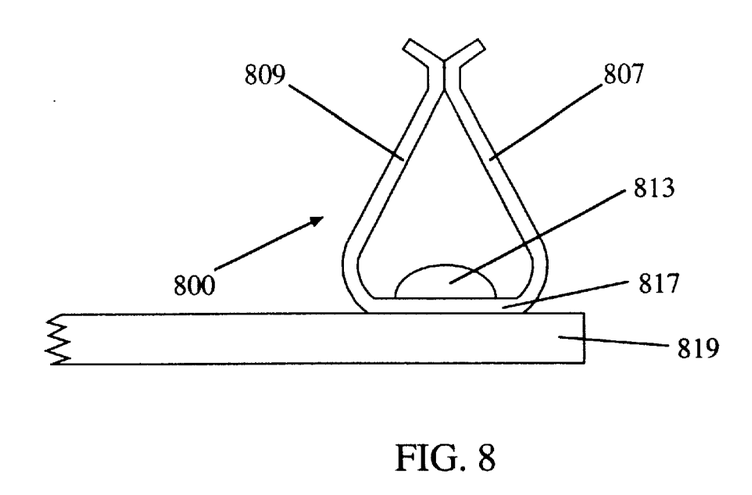
FIG. 8 is a front elevation view of a side of another embodiment of the shield clip in accordance with the invention.

FIG. 8 is a front elevation view of a side of another embodiment of a shield clip in accordance with the invention. As illustrated in FIG. 8, a shield clip 800 is shown having two side walls 807 and 809. The shield clip 800 may be similar to any shield clip known in the art, such as the shield clip 100 or 200, or the shield clip 300 of the present invention. It is desirable to have the shield clip 800 further include a bump 813 positioned on the base 817. The base plate 817 is affixed to a circuit board 819. The bump 813 is a projection or protuberance which prevents the lower edge of a shield cover (e.g., the lower portion 311 of the shield cover 400 of FIG. 5) from reaching or touching the base 817. By maintaining a distance from the base 817, the lower portion 311 of the shield cover 400 may thereby avoid contact with solder reflow that, in some cases, reaches the base 817. Typically, the distance between the lower portion 311 and the base 817 may be in the range of about 0.50–0.80 millimeters. Avoiding contact with the solder reflow ensures that the shield cover 400 remains removable from the shield clip 800. Depending on the particular application, the dimensions of the bump 813 may vary. In one embodiment, the height of the bump may be in the range of about 0.50–0.80 millimeters.

It will be understood by those having ordinary skill in the art that the function performed by the bump 813 may be achieved using any of many other structures which are an obvious variation of the bump 813. For example, the structure that performs the function of the bump 813 may, alternatively, comprise a projection extending from one or both of the side walls.

Figure 9:
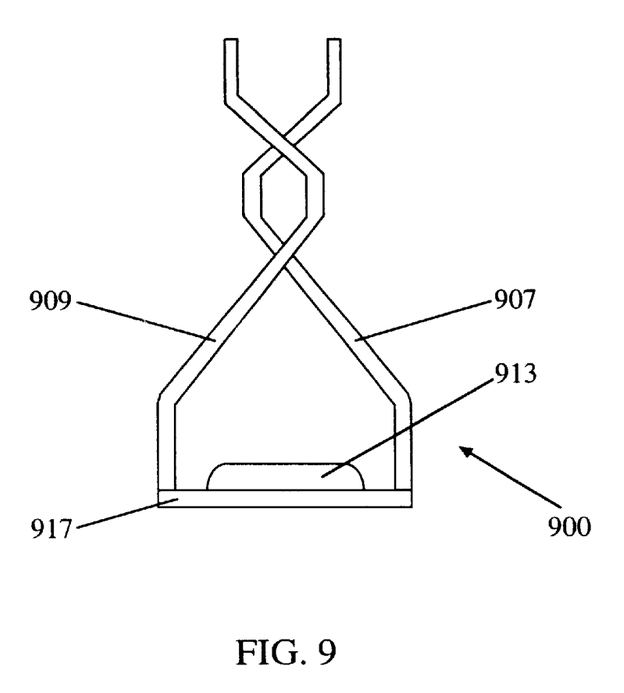
FIG. 9 is a front elevation view of a side of another embodiment of the shield clip in accordance with the invention.

FIG. 9 is a front elevation view of a side of another embodiment of a shield clip in accordance with the invention. As illustrated in FIG. 9, a shield clip 900 comprises the shield clip 300 (FIG. 3) having a bump 913 positioned on a base 917. As noted above, the bump 913 is a projection or protuberance which prevents the lower portion of a shield cover (e.g., shield cover 400 of FIG. 5) from reaching or touching the base 917.

Figure 10:
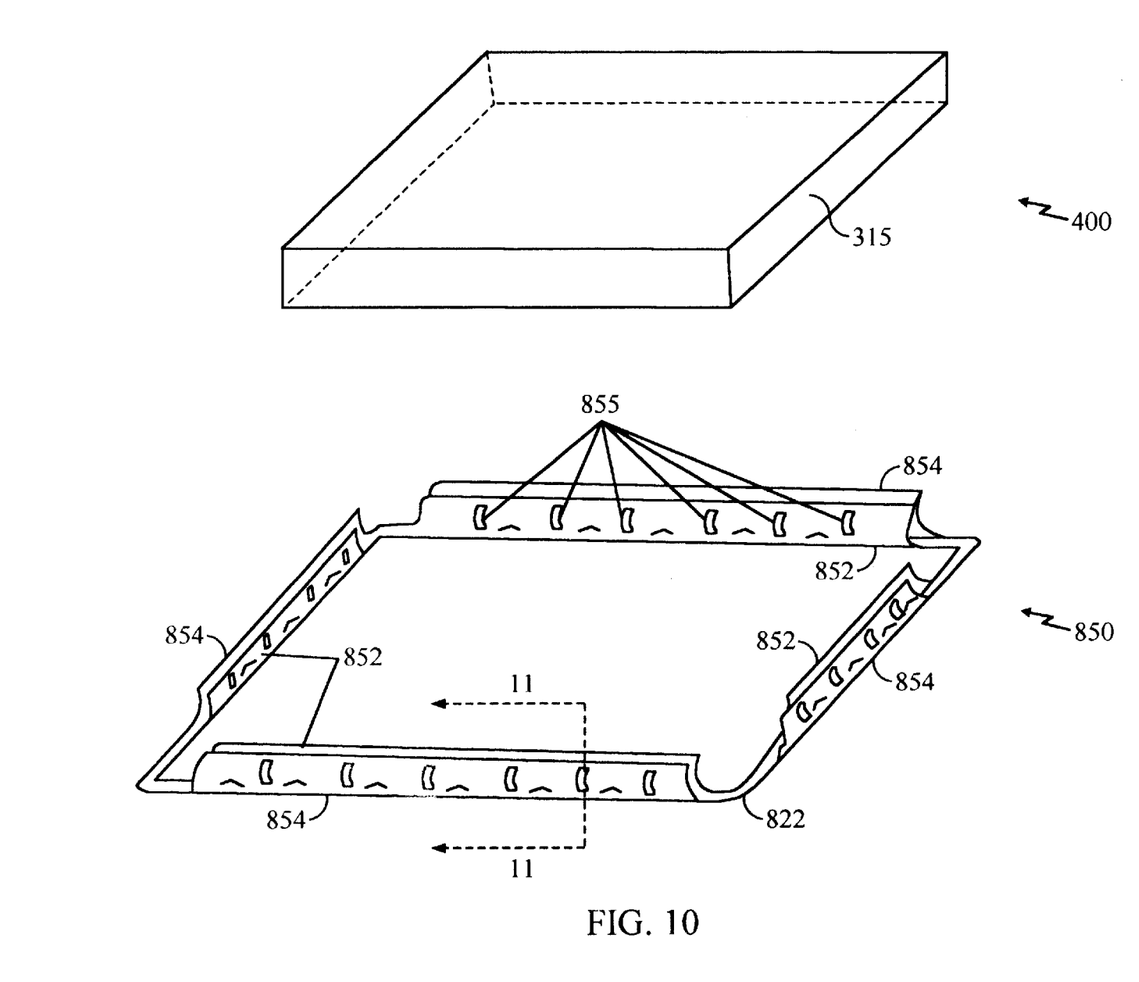
FIG. 10 is a perspective view of another embodiment of the shield clip in accordance with the invention.

FIG. 10 is a perspective view of another embodiment of the shield clip in accordance with the invention. The shield clip 850 may have a rectangular shape defined by a base plate 822 with two or more upwardly directed side walls 852 and 854 suitable for receiving and retaining the downwardly oriented walls 315 of the four-sided cover 400. As shown in FIG. 10, each of the side walls 852 and 854 extend upwardly from the base plate 822, so that the side walls 852 and 854 may lie in substantially parallel geometric planes. In this embodiment, the side wall 852 may be described as the inside wall of the shield clip 850. As will be more fully explained below, each side wall 852 includes one or more holes or openings 855 located about half-way upwardly from the base plate 822 and substantially equidistantly distributed from each other along the length of the side wall 852. The openings 855 may be located in any desired place on the side wall 852 and, hence, do not necessarily have to be located as illustrated in FIG. 10. Each of the openings 855 may receive at least a portion of the other side wall 854. As explained in greater detail in the next section, each pair of side walls 852 and 854 presses against the wall 315 of the cover 400 to retain that wall between them.

Figure 11:
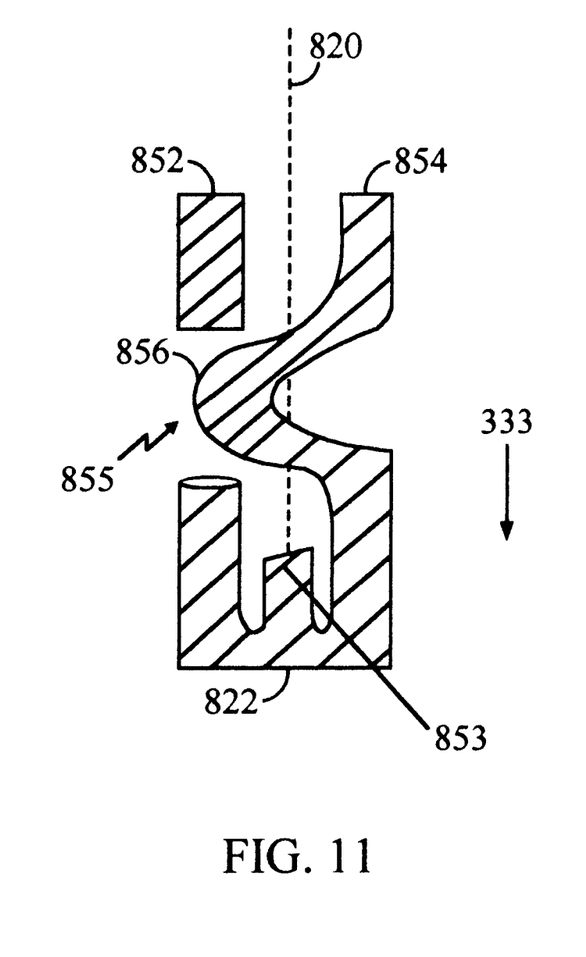
FIG. 11 is a cross-sectional view of a side of the shield clip taken along line 11—11 of FIG. 10.

FIG. 11 is a cross-sectional view of a side of the shield clip 850 taken along line 11—11 (FIG. 10). As shown in FIG. 11, the two side walls 852 and 854 extend upwardly and away from a base 822. For the purpose of illustration, a virtual geometric plane 820 that is normal to the base 822 is also shown. The side wall 854 includes one or more middle segments 856 extending inwardly and away from the side wall 854. In its resting position, the tension of the side wall 854 causes at least a portion of the middle segment 856 to be in the region to the left of the normal plane 820. Moreover, at least a portion of the middle segment 856 may enter into the opening 855 on the side wall 852.

It is desirable to have the middle segment 856 be located at substantially the same elevation from the base 822 and depth as the opening 855, so that at least a portion of the middle segment 856 substantially aligns with the opening 855. It is further desirable to have the design of the shield clip 850 be dimension-independent. Hence, the shield clip 850 having any desirable dimensions fit to a particular application may be used. For example, the length and width of the base 822 may be in the range of about 0.05–2 and 0.05–0.20 inches, respectively. The height of the shield clip 850 may be in the range of about 0.10–0.40 inches.

To allow insertion of the shield wall 315 (FIG. 10), the lower portion 311 (FIG. 5) slides between and pushes each of the side walls 852 and 854 outwardly causing the two side walls 852 and 854 to move apart and against the direction of their spring loading. The outward deflection of the side walls 852 and 854 allows insertion of the lower portion 311 in the direction of arrow 333. Once the shield wall is placed between the side walls 852 and 854, the tension of the side wall 854 forces the middle segment 856, and tension of the side wall 852 forces itself, to each press against its contact surface on the shield wall 315. The pressing action by the middle segment 856 and side wall 852 acts to retain the lower portion 311 in a fixed position relative to the shield clip 850.

Furthermore, the ability to so retain the lower portion 311 is particularly enhanced in this embodiment by the protuberance of the middle segment 856 of the side wall 854. This enhanced pressing action ensures a long-lasting grip of the shield wall 315, despite repetitive removal of the shield wall 315 from the shield clip 850. Moreover, the shield cover 400 may easily be removed from the shield clip 300 by exerting reasonable pulling force on the shield cover 400 away from the shield clip 850 (i.e., in a direction opposite to the arrow 333).

It will be desirable to have the shield clip 850 further include a bump 853 positioned on the base 822. The bump 853 is a projection or protuberance which prevents the lower edge of a shield cover (e.g., the lower portion 311 of the shield cover 400 of FIG. 5) from reaching or touching the base 822. As explained above, by maintaining a distance from the base 822, the lower portion 311 of the shield cover 400 may thereby avoid contact with solder reflow that, in some cases, reaches the base 822. It will be understood by those having ordinary skill in the art that the function performed by the bump 853 may be achieved using any of many other structures which are an obvious variation of the bump 853. For example, the structure that performs the function of the bump 853 may, alternatively, comprise a projection extending from one or both of the side walls.

Figure 12:
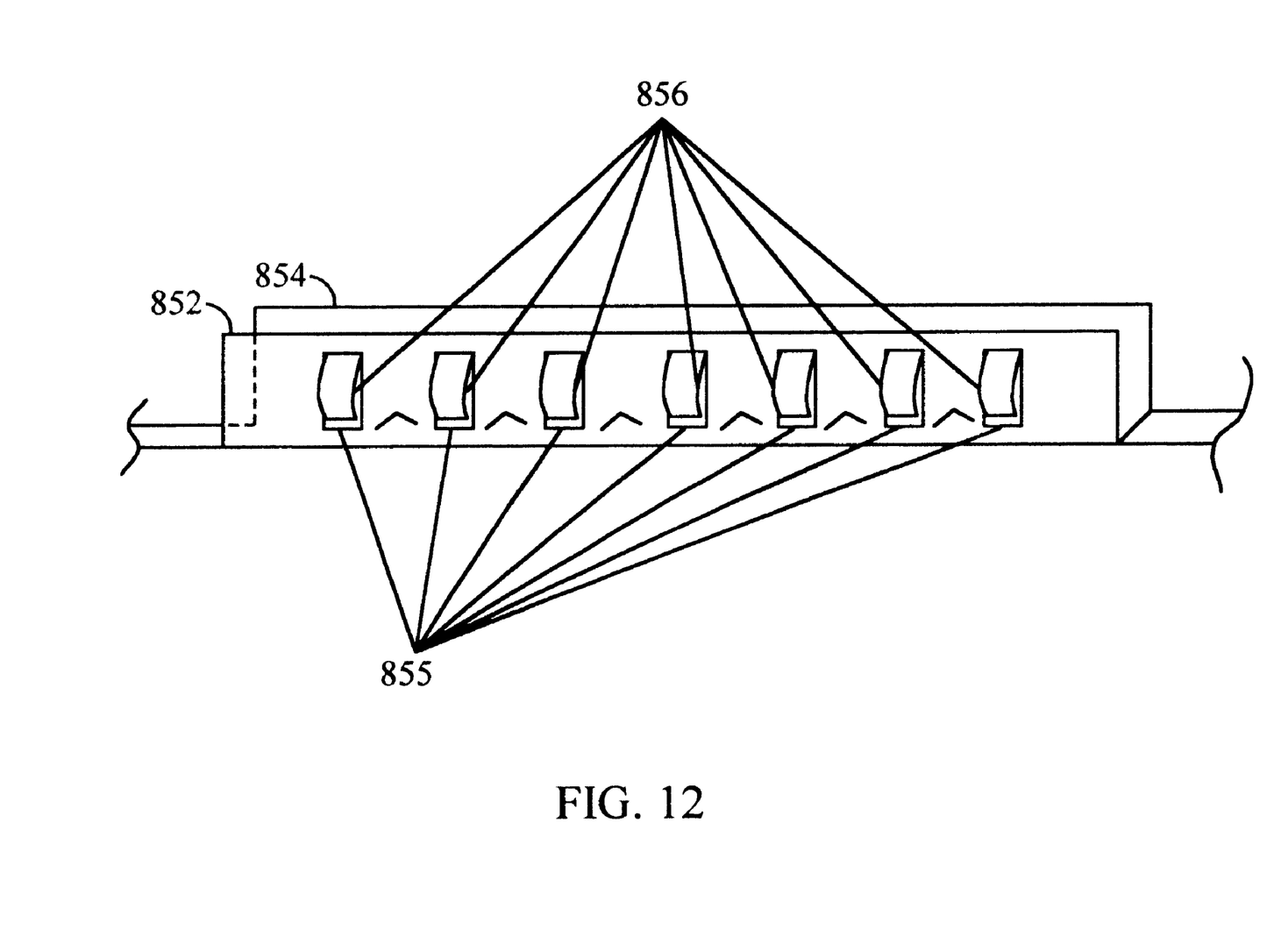
FIG. 12 is a side perspective view of a section of the shield clip of FIG. 10.

FIG. 12 is a side perspective view of a section the shield clip 850. As shown in FIG. 12, the side walls 852 and 854 may be positioned substantially parallel to each other along the length of the base 822. As noted above, in their resting position, at least a portion of each middle segment 856 crosses over the geometric plane 820 (FIG. 11) and may reach its respective opening 855. Upon insertion of the lower portion 311, the middle segment 856 deflects away from the cross-over position and past the geometric plane 820. The greater the plurality of middle segments 856, the larger is the surface area from the contact between the side wall 856 and the shield wall 315. The increased surface area of contact ensures a grip having sufficient force to retain the shield cover 400 in place.

In view of the foregoing, it will be appreciated that the invention overcomes the long-standing need for a shield clip that retains spring tension despite repetitive removal of the shield cover. Moreover, the invention provides a shield clip that prevents the shield cover from being stuck because of its contact with solder reflow. The invention may be embodied in other specific forms without departing from its spirit or essential characteristics. The described embodiment is to be considered in all respects only illustrative and not restrictive. The scope of the invention is, therefore, indicated by the appended claims rather by the foregoing description. All changes that fall within the meaning and range of equivalency of the claims are to be embraced within their scope.

What is claimed is:

1. A clip configured to attach a cover onto a circuit board, the clip comprising:

a base plate for affixing said clip to the circuit board;

at least one right side wall connected to the base plate, the right side wall having a right upper portion; and at least one left side wall connected to the base plate, the left side wall having a left upper portion, wherein the upper portions are configured to overlap in their resting position;

wherein the base plate includes a protuberance mounted thereon.

2. A clip configured to retain a cover onto a circuit board, the clip comprising:

a base Plate having right and left sides, the base plate being configured to be fixed to the circuit board;

at least two right side walls connected to and extending upwardly away from the right side of the base, each of the right side walls having a right upper portion; and at least two left side walls connected to and extending upwardly away from the left side of the base, each of the left side walls having a left upper portion, wherein the right and left side walls are spring biased inwardly so that at least a portion of the right and left upper portions overlap;

wherein the base plate includes a raised region configured to prevent the cover from directly touching the base plate.

3. A method of securing a cover to a circuit board, the method comprising:

fixing a clip onto the circuit board, the clip comprising a base plate having at least one right side wall and at least one left side wall connected to the base plate, each right side wall having a right upper portion and each left side wall having a left upper portion, wherein at least a portion of the upper portions are spring biased to overlap in their resting position;

sliding at least a portion of the cover between the right and left side walls, so that each of the right and left side walls presses against at least a portion of the cover; and mounting a protuberance onto at least a portion of the base plate.

4. A method of securing a cover to a circuit board, the method comprising:

fixing a clip onto the circuit board, the clip comprising a base plate having at least one right side wall and at least one left side wall connected to the base plate, each right side wall having a right upper portion and each left side wall having a left upper portion, wherein at least a portion of the upper portions are spring biased to overlap in their resting position; and sliding at least a portion of the cover between the right and left side walls, so that each of the right and left side walls presses against at least a portion of the cover;

wherein the step of fixing a clip includes the step of fixing a base plate having a protuberance mounted thereon.

5. A clip configured to attach a cover onto a circuit board, the clip comprising:

a base plate which is configured to be fixed to the circuit board;

a right side wall connected to the base plate, the right side wall having at least one opening; and a left side wall connected to the base plate, the left side wall having at least one middle segment that extends towards the right side wall and away from the left side wall, wherein at least a portion of the middle segment is substantially aligned with the opening;

wherein the base plate includes a protuberance mounted between the left and right side walls.

6. A method of securing a cover to a circuit board, the method comprising:

fixing a base plate onto the circuit board, the base plate having a right side wall and left side wall connected to the base plate, the right side wall having at least one opening and the left side wall having at least one middle segment that extends towards the right side wall and away from the left side wall, wherein at least a portion of the middle segment is substantially aligned with the opening;

sliding at least a portion of the cover between the right and left side walls, so that each of the right and left side walls presses against at least a portion of the cover; and mounting a protuberance along and onto at least a portion of the base plate.

7. A method of securing a cover to a circuit board, the method comprising:

fixing a base plate onto the circuit board, the base plate having a right side wall and left side wall connected to the base plate, the right side wall having at least one opening and the left side wall having at least one middle segment that extends towards the right side wall and away from the left side wall, wherein at least a portion of the middle segment is substantially aligned with the opening; and sliding at least a portion of the cover between the right and left side walls, so that each of the right and left side walls presses against at least a portion of the cover;

wherein the step of fixing a base plate includes the step of fixing a base plate having a protuberance mounted thereon.

* * * * *